US011269032B2

(12) United States Patent
Bindseil et al.

(10) Patent No.: US 11,269,032 B2
(45) Date of Patent: Mar. 8, 2022

(54) METHOD OF REDUCING SPATIAL EXTENT OF GRADIENT COIL CURRENT FEEDING CONNECTORS

(71) Applicant: Synaptive Medical Inc., Toronto (CA)

(72) Inventors: Geron Andre Bindseil, Toronto (CA); William Bradfield Handler, Toronto (CA)

(73) Assignee: SYNAPTIVE MEDICAL INC., Toronto (CA)

(*) Notice: Subject to any disclaimer, the term of this patent is extended or adjusted under 35 U.S.C. 154(b) by 850 days.

(21) Appl. No.: 15/983,853

(22) Filed: May 18, 2018

(65) Prior Publication Data
US 2019/0353728 A1 Nov. 21, 2019

(51) Int. Cl.
| | | |
|---|---|---|
| G01R 33/385 | (2006.01) | |
| G01R 33/38 | (2006.01) | |
| G01R 33/3875 | (2006.01) | |
| H01F 5/04 | (2006.01) | |
| H01F 41/10 | (2006.01) | |

(52) U.S. Cl.
CPC ..... *G01R 33/3858* (2013.01); *G01R 33/3802* (2013.01); *G01R 33/3852* (2013.01); *G01R 33/3856* (2013.01); *G01R 33/3875* (2013.01); *H01F 5/04* (2013.01); *H01F 41/10* (2013.01)

(58) Field of Classification Search
CPC ............ G01R 33/3858; G01R 33/3852; G01R 33/3802; G01R 33/3875; G01R 33/3856; H01F 41/10; H01F 5/04
See application file for complete search history.

(56) References Cited

U.S. PATENT DOCUMENTS 5,568,051 A * 10/1996 Yamagata ............ G01R 33/385
324/318
2005/0168222 A1 8/2005 Arz et al.
2012/0074942 A1 * 3/2012 Hollis .................. G01R 33/385
324/318
(Continued)

FOREIGN PATENT DOCUMENTS

EP 2742860 6/2014
WO WO 2017077368 5/2017

OTHER PUBLICATIONS

Search Report issued by the Intellectual Property Office of the United Kingdom in relation to corresponding GB Application No. GB1907020.0 dated Nov. 1, 2019, 5 pages.

*Primary Examiner* — Daniel R Miller

(57) ABSTRACT

A magnetic resonance (MR) imaging system includes: a main magnet configured to generate a volume of magnet field suitable for forming MR imaging; a transmit radio frequency (RF) coil assembly configured to transmit at least one RF signal; a receive radio frequency (RF) coil assembly configured to, in response to the at least one RF pulse, receive MR signals; a gradient coil assembly comprising (i) windings of coils arranged in a radial layer, and (ii) a first set of connectors embedded in the radial layer to reduce a radial extent occupied by the gradient coil assembly, the first set of electrical connectors configured to drive the windings of coils; and a control unit coupled to the transmit RF coil assembly, the receive RF coil assembly, and the gradient coils, the control unit configured to synchronously operate the gradient coil assembly, the transmit coil assembly, and the receive coil assembly.

18 Claims, 7 Drawing Sheets

(56) References Cited

U.S. PATENT DOCUMENTS

| | | | |
|---|---|---|---|
| 2013/0271139 A1* | 10/2013 | Grodzki | G01R 33/482 324/314 |
| 2014/0167762 A1* | 6/2014 | Sugiyama | G01R 33/3858 324/322 |
| 2014/0176138 A1 | 6/2014 | Imamura et al. | |
| 2015/0177347 A1* | 6/2015 | Tsujita | G01R 33/3858 324/322 |
| 2015/0276896 A1* | 10/2015 | Sakakura | G01R 33/3858 324/322 |

* cited by examiner

METHOD OF REDUCING SPATIAL EXTENT OF GRADIENT COIL CURRENT FEEDING CONNECTORS

BACKGROUND

The present disclosure relates to magnetic resonance imaging.

SUMMARY

In one aspect, some implementations provide a magnetic resonance (MR) imaging system, including: a housing having a bore shaped and sized to accommodate at least a portion of a subject; a main magnet accommodated by the housing and configured to generate a volume of magnet field suitable for forming MR imaging over a region located within the bore and covered by the volume of magnetic field; a transmit radio frequency (RF) coil assembly configured to transmit at least one RF signal into the portion of the subject; a receive radio frequency coil assembly configured to, in response to the at least one RF pulse, receive MR signals emitted from the portion of the subject; a gradient coil assembly comprising (i) windings of coils arranged in a radial layer, and (ii) a first set of connectors embedded solely in the radial layer to reduce a radial extent occupied by the gradient coil assembly, the first set of electrical connectors configured to drive the windings of coils with sufficient currents suitable to generate perturbations to the volume of magnet field such that the MR signals encode an MR image over the region and in accordance with the generated perturbations; and a control unit coupled to the transmit RF coil assembly, the receive RF coil assembly, and the gradient coils, the control unit configured to synchronously operate the gradient coil assembly, the transmit coil assembly, and the receive coil assembly.

Implementations may include one of more of the following features.

The radial layer may include a depressed area where the first set of electrical connectors are inlaid such that the first set of electrical connectors are, at least in part, radially constrained between the radial layer's outer surface and inner surface. The first set of electrical connectors may be separated from the underlying radial layer by electrical insulation material. The gradient coil assembly may be configured to generate perturbations to the volume of magnet field along a longitudinal axis of the bore or transverse to the longitudinal axis of the bore.

The MR imaging system may further include shield gradient coils arranged radially outside the windings of coils of the gradient coil assembly and configured to generate a varying magnetic field that attenuates a different varying magnetic field generated by the gradient coil assembly outside of the bore.

The MRI system may further include shimming coils located on the radial layer or a different radial layer, wherein the shimming coils are configured to improve a homogeneity of the magnetic field within the region for MR imaging, wherein the shimming coils are driven by shimming currents provided through a second set of electrical connectors located on the radial layer or the different radial layer, wherein the second set of electrical connectors are different from the first set of electrical connectors.

The MR imaging system may further include cooling structures inlaid in the radial layer and configured to provide cooling when the windings of coils of the gradient coil assembly are driven with sufficient currents suitable to generate perturbations to the volume of magnet field.

The gradient coil assembly may be coupled to a gradient amplifier through the first set of electrical connectors. The first set of electrical connectors may be configured to receive currents up to root mean square (rms) 400 A continuous.

The gradient amplifier may drive the gradient coil assembly through the first set of electrical connectors with sufficient currents suitable to generate perturbations to the volume of magnet field that are along and transverse a longitudinal axis of the bore. The control unit may be further configured to reconstruct a magnetic resonance (MR) image based on the MR signals.

The MR imaging system may further include a display on which the MR image is presented.

In another aspect, implementations may include method for manufacturing an MRI system, the method including: configuring a housing that includes a bore shaped and sized to accommodate at least a portion of a subject; arranging a main magnet to be accommodated by the housing and configuring the main magnet to generate a volume of magnet field suitable for forming MR imaging over a region located within the bore and covered by the volume of magnetic field; configuring a transmit radio frequency (RF) coil assembly capable of transmitting at least one RF signal into the portion of the subject; configuring a receive radio frequency (RF) coil assembly capable of, in response to the at least one RF pulse, receiving MR signals emitted from the portion of the subject; configuring a gradient coil assembly by: arranging windings of coils arranged in a radial layer, and embedding a first set of electrical connectors solely in the radial layer to reduce a radial extent occupied by the gradient coil assembly and configuring the first set of electrical connectors to drive the windings of coils with sufficient currents suitable to generate perturbations to the volume of magnet field such that the MR signals encode an MR image over the region and in accordance with the generated perturbations; and configuring a control unit to be coupled to the transmit RF coil assembly, the receive RF coil assembly, and the gradient coils such that the control unit is capable of synchronously operating the gradient coil assembly, the transmit coil assembly, and the receive coil assembly.

Implementations may include one or more the following features.

Embedding the first set of electrical connectors comprises inlaying the first set of electrical connectors in a depressed area on the radial layer such that the first set of electrical connectors are, at least in part, radially constrained between the radial layer's outer surface and inner surface.

Embedding the first set of electrical connectors in a depressed area may comprise soldering the first set of electrical connectors to provide an electrical connection to the windings of coils, and wherein the electrical connection is formed in the depressed area such that the first set of electrical connectors do not extend above the outer surface of the radial layer.

The method may further include: arranging shield gradient coils radially outside the windings of coils of the gradient coil assembly; and configuring the shield gradient coil to be capable of generating a varying magnetic field that attenuates a different varying magnetic field generated by the gradient coil assembly outside of the bore.

The method may further include: arranging shimming coils to be positioned on the inside or the outside of the radial layer; and configuring the shimming coils to improve a homogeneity of the magnetic field within the region for MR imaging when the shimming coils are driven by shimming currents provided through a second set of electrical connectors different from the first set of electrical connectors.

The method may further include: arranging cooling structures to be positioned on the radial layer or on a different radial layer underneath the radial layer; and configuring the cooling structures such that cooling is effectuated when the windings of coils of the gradient coil assembly are driven with sufficient currents suitable to generate perturbations to the volume of magnet field.

The method may further include: coupling the gradient coil assembly to a gradient amplifier through the first set of electrical connectors capable of receiving currents up to root mean square (rms) 400 A continuous.

The method may further include: coupling the control unit to a display such that when the control unit has reconstructed an magnetic resonance (MR) image based on the MR signals, the display is configured to present the reconstructed MR image.

The details of one or more aspects of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference symbols in the various drawings indicate like elements.

DETAILED DESCRIPTION

Various embodiments and aspects of the disclosure will be described with reference to details discussed below. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosure.

Gradient coils are employed by magnetic resonance imaging (MRI) systems. An example of a gradient coil assembly on an MRI system may provide perturbation of the main magnetic field during an MRI imaging sequence so that MR signals may encode proton resonance emitted from various parts of a subject during an MR scan and an MR image may be reconstructed based on the MR signals. Gradient coils tend to be physically large and massive components of the MRI system with many layers. Yet, gradient coil designs typically do not have abundant layer space available for the internal structures. For a cylindrical gradient coil, the outer diameter should be as small as possible to accommodate, for example, a smaller main magnet for cost and siting advantages while the inner diameter should be as large as possible to accommodate, in particular, a larger patient bore for comfort and access. When balancing such competing design goals, the performance of the gradient coil can be improved by having the primary innermost gradient coil layers located as close as possible to the inner patient-side surface of the gradient coil and the shielding gradient coil layers be as close as possible to the outer magnet-side surface of the gradient coil. For a gradient coil layer to operate, a method of electrical current supply and return should be established to have at least one of the feeding electrical connectors overlap with the coil layer at some distance from its outer edge. If such an electrical connector takes up layer space, then the available space for placing other components is reduced, further compounding the space limitations. This situation can be problematic especially where the adjacent layer has features which have a perpendicular direction to the electrical connector, for example, a spiral of cooling hoses. The same issues generally plague the design and development of electromagnet systems with multiple layers. In other words, such issues may not be limited to gradient coils on an MRI system.

Implementations of the disclosure endeavor to reduce or even eliminate layer space used by feeding electrical connectors by providing a channel or depression in, for example, the gradient coil layer in which the feeding electrical connectors are embedded such that its height above the gradient coil layer is reduced or substantially eliminated, as explained below.

Figure 1A:
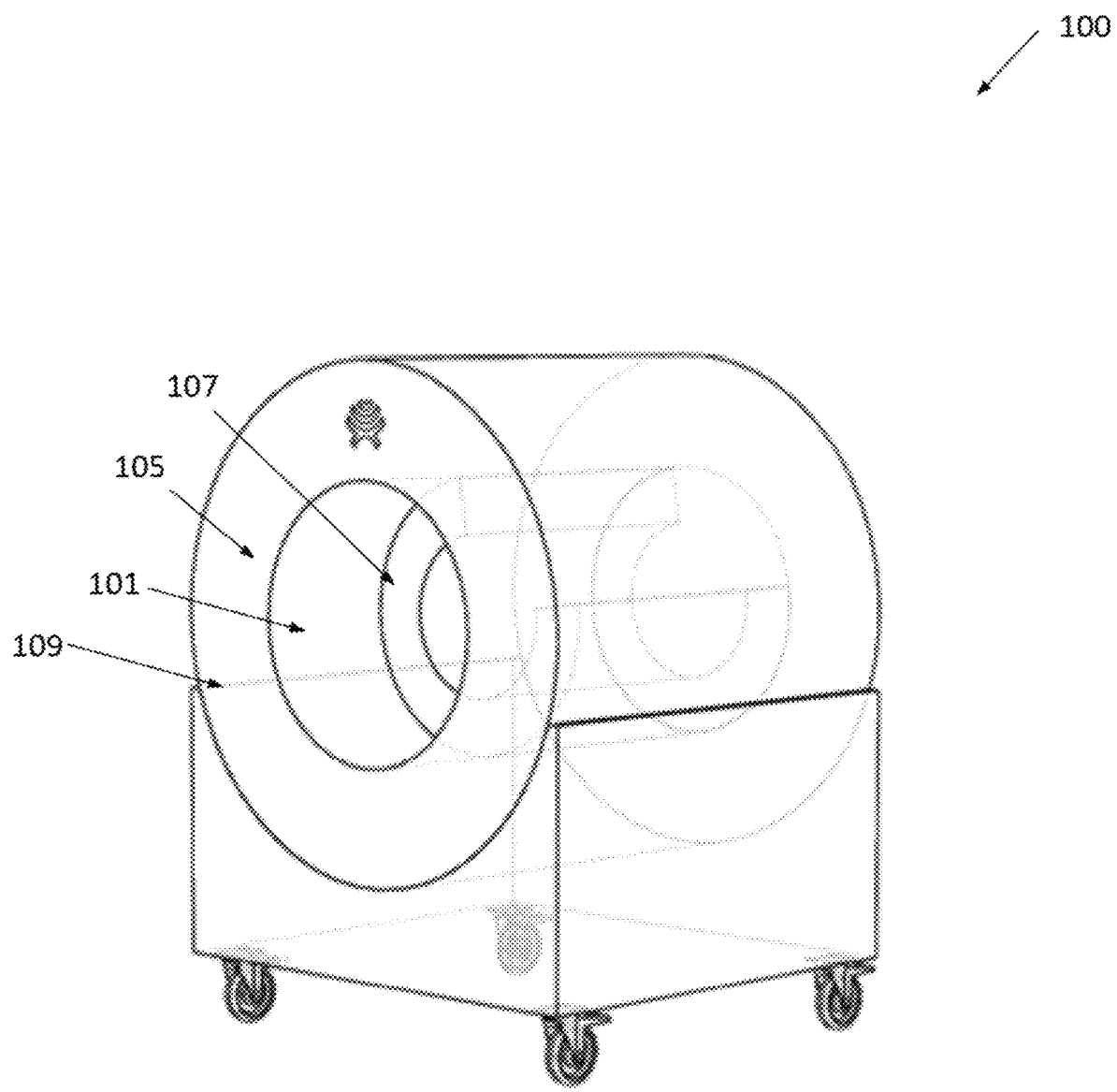
FIG. 1A shows a perspective view of an example of a magnetic resonance imaging (MRI) system with a solenoid magnet.
Figure 1B:
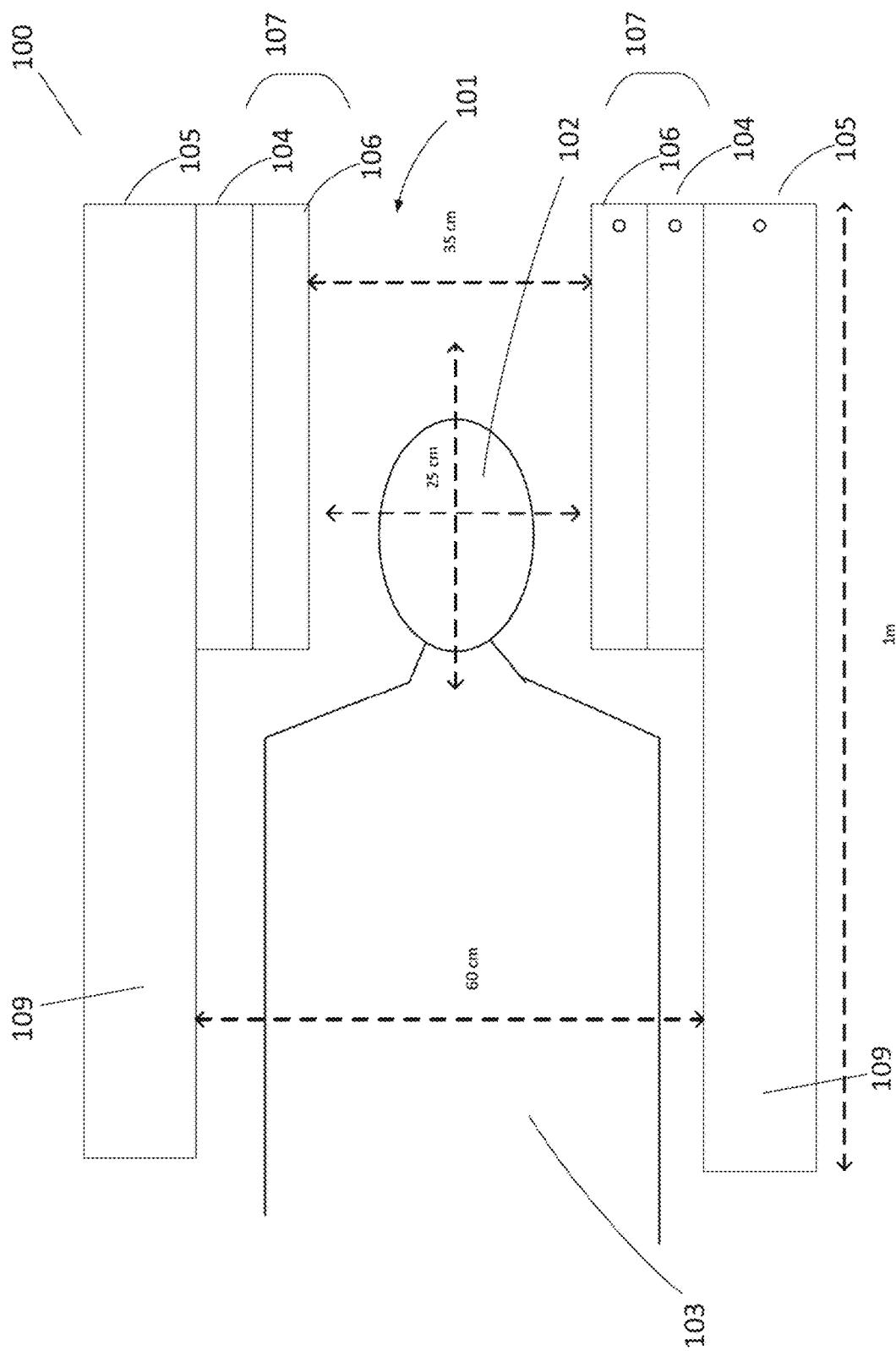
FIG. 1B shows a cross-sectional illustration of the example of a magnetic resonance imaging (MRI) system.

FIGS. 1A-1B show a perspective view and a cross-sectional view of an example of a magnetic resonance imaging (MRI) system 100 in which a solenoid magnet 105 is provided in a cylindrical shape with an inner bore 101. Coil assembly 107, including transmit RF coil 106 and gradient coil 104, is provided within solenoid magnet 105. Coil assembly 107 may generally be shaped as an annular structure and housed within the inner bore of solenoid magnet 105. In some implementations, coil assembly 107 is annular and only includes gradient coil 104. In these implementations, annular coil assembly does not include transmit RF coil 106 or any receiver coil. For these implementations, radio frequency (RF) excitation pulses are, for example, transmitted by local coils for imaging the head region 102 of patient 103. In one instance, a head coil in a birdcage configuration is used for both transmitting RF excitation pulses and receiving MR signals for imaging the subject. An example of a birdcage configuration is shown in FIG. 2, which may be used as a transmit-only RF coil assembly. In this case, a birdcage coil may be used for transmitting an RF excitation pulse into the subject and a parallel array coil configuration is used for receiving MR signals in response.

In some implementations, shimming coils 109 are housed within the gradient coil assembly. Shimming coils 109 are powered by a group of power amplifiers. In some cases, the power amplifiers are housed in a control room and are connected to shimming coils 109 to provide shimming of the magnetic field within inner bore 101. In driving shimming coils 109, power amplifiers may be controlled by a control unit that generally includes one or more processors as well as programming logic to configure the power amplifiers. In some instances, the control unit is housed in a control room separate from the solenoid magnet 105 of the MRI system 100. The control unit is further configured to reconstruct a magnetic resonance (MR) image based on the MR signals. The MRI system may include a display on which the reconstructed MR image is presented, for example, to a human operator. The driving current for shimming coils 109 may be in the range of hundreds of miliamperes and generally do not exceed 20 ampere. Further, shimming coils 109 may not require active cooling using circulating coolant. In these implementations, an array of shimming coils can be used to provide adjustment to the field strength within the inner bore 101 such that the magnet field within the inner bore 101 becomes more homogenous.

The implementations described in this disclosure may be adapted for intraoperative MRI, and MRI systems for use in an emergency room setting. Such MRI systems may include a smaller and more compact bore size magnet compared to the magnets from conventional whole body scanners. One consequence of a smaller bore magnet is that, the volume of uniform magnetic field suitable for imaging (e.g., with field inhomogeneity below a defined threshold) may not cover all areas of interest.

Referring to FIGS. 1A to 1B, the transmit RF coil 106 is a resonant structure that excites the sample during a magnetic resonance imaging (MRI) acquisition. The resonant frequency of the transmit RF coil 106 is tuned to the Larmor frequency for the nuclei of interest and field strength of the MRI system 100. The input impedance of the tuned RF coil is then transformed at the coil input to match the amplifier characteristic impedance (typically 50Ω).

Gradient coil 104 generally provides field gradients in more than one direction, such as, for example, all three orthogonal spatial directions. Thus, gradient coil 104 may refer to three sets of coils, each configured to generate field fluctuations in a respective direction for the main field in the inner bore of the solenoid magnet 105. Such field fluctuations may cause magnetizations from various spatial locations to experience precessions at different frequencies, enabling encoding of spatial information of the magnetizations through RF excitation pulses.

In more detail, gradient coils can be physically large and massive components of the MRI system with many layers. A gradient coil's internal structure can include space for electromagnets that make up the X, Y and Z gradient coil axes, higher-order shim coil axes, passive shim trays, structures for mechanical support, and tubing or components of the cooling system. Gradient coil design can be limited by available layer space for these structures. For a cylindrical gradient coil, the outer diameter should be made as small as possible to accommodate a smaller main magnet for cost and siting advantage while the inner diameter should be kept as large as possible to accommodate a larger patient bore for comfort and access. These preferences are analogous for other gradient coil geometries, for example planar gradient coils. Such competing design goals must be balanced by the performance of the gradient coil which is improved by having the primary innermost gradient coil layers be as close as possible to the inner patient-side surface of the gradient coil and the shielding gradient coil layers be as close as possible to the outer magnet-side surface of the gradient coil. If the individual gradient coil layers could be made in such a way as to reduce the radial space while preserving the physical extents of the entire structure, then shield gradient coil layers could be placed farther from primary gradient coil layers, thus increasing possible performance, or more space would be available in the internal structure of the gradient coil to accommodate, for example, additional shim coil layers or cooling layers.

A method of electrical current supply and return may be used to operate the gradient coil 104. This method may utilize at least one of the feeding electrical connectors for providing the current supply. On a conventional gradient coil system, this feeding electrical connector overlaps with the gradient coil layer at least some distance from the outer edge of gradient coil layer. Because such an electrical connector takes up layer space on the conventional gradient coil system, space for placing other components is thus further reduced. This situation is problematic especially where the adjacent layers possess features arranged in a direction substantially perpendicular to the electrical connector, for example a spiral of cooling hose. The same issues generally plague the design and development of electromagnet with multiple layers, not just gradient coils for MRI systems.

To use less layer space, gradient coils may be designed to have all electrical contacts for each loop occur at the end of the coil where there may be more space to interleave connectors, but the drawback with this approach is that it imposes a design restriction which can limit performance of the gradient coil system in terms of the range and extent of perturbations to the main magnetic field that can be realized. As explained, the perturbations to the main magnetic field determine the encoding of nuclei magnetic resonance signals emitted from a subject placed inside the magnetic field to form an MR image.

Another approach is to orient layer stacking such that the electrical connectors lie in between gaps of adjacent layer structures. This approach can be equally undesirable because it is not always feasible without imposing design restrictions.

In yet another approach, the electrical connectors can be brought back in other layer spaces where there may be room farther away from the respective layer, but the drawback is that this approach reduces the electromagnetic cancellation of the magnetic field deviation introduced by the jog of the wire pattern of the gradient coil layer.

In sum, most conventional systems incorporate gradient coils that are designed with connectors occupying radial space, thus increasing the extent of the physical space that the gradient coil layers would otherwise occupy.

Figure 2B:
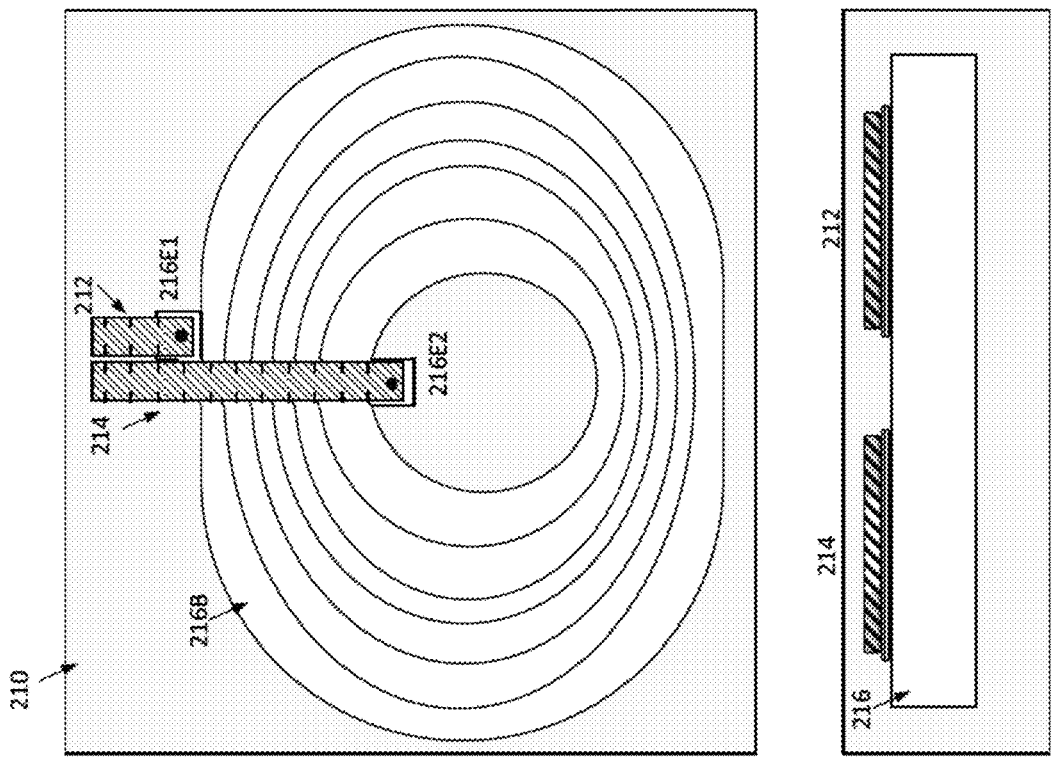
FIGS. 2A to 2B illustrates examples of reducing the spatial extent of a gradient coil assembly.
Figure 2A:
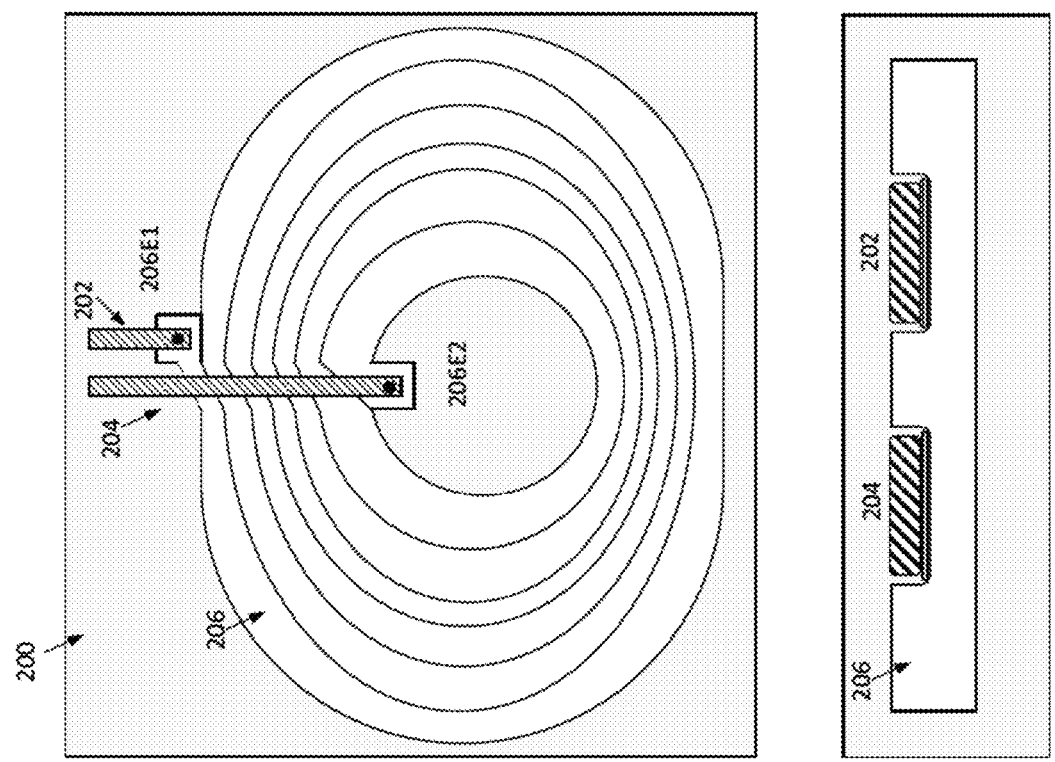

Referring to FIGS. 2A-2B, examples of embodiments that embed or flatten the current feeding connectors in a gradient coil assembly in a manner that achieves radial space reduction and preserves gradient system performance. The perspective views in the top panels demonstrate general examples of spiral-shape electromagnets ('thumbprints') viewed from the top down or bottom up. These perspectives may be flat (as shown in the figures) or they may be curved, similar to the view shown in FIGS. 3A to 3C. These features are generally curved for cylindrical-geometry MRI gradients. For other geometries of MRI systems, such as permanent magnet designs with planar gradients, these kinds of electromagnets are designed to be kept flat.

Radial layer 206 represents an outer surface on a cylindrical structure that houses windings of coils, as illustrated by the spiral lines. Radial layer 206 may be made from, for example, carbon fiber/epoxy composite material. These coil windings form the backbone of a gradient coil assembly from which perturbations to the main magnetic field are generated for the purposes of encoding a nucleic magnetic resonance signal. Here, the cylindrical structure has a first end 206E1 and a second end 206E2. A first current feeding connector 202 is located at the first end 206E1 while a second current feeding connector 204 is located at the second end 206E2. Currents can flow into the windings of coils through one of the current feeding connectors and then flow out of the windings of coils through the other of the current feeding connectors.

Figure 3A:
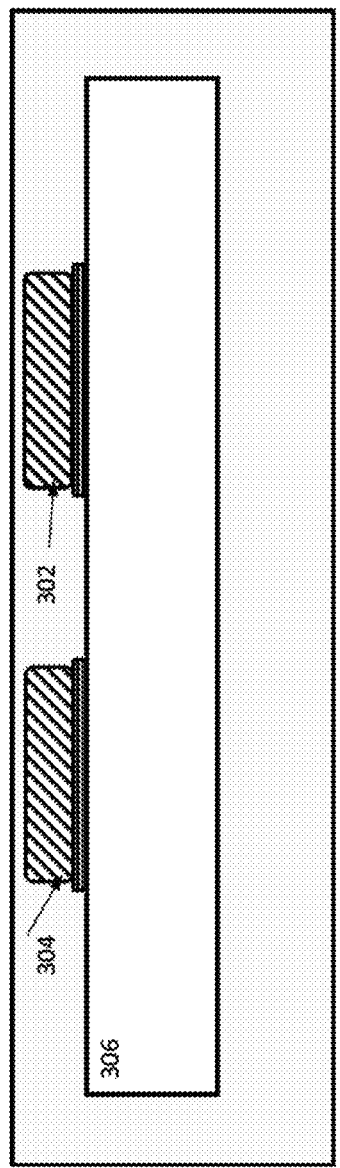
FIGS. 3A to 3C illustrates perspective views of reducing the radial footprint of current feeding connectors on a prototype gradient coil assembly.
Figure 3B:
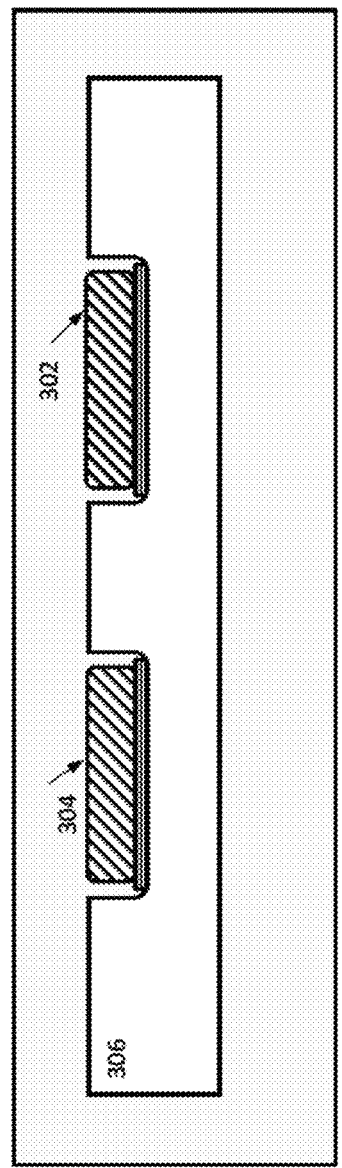
Figure 3C:
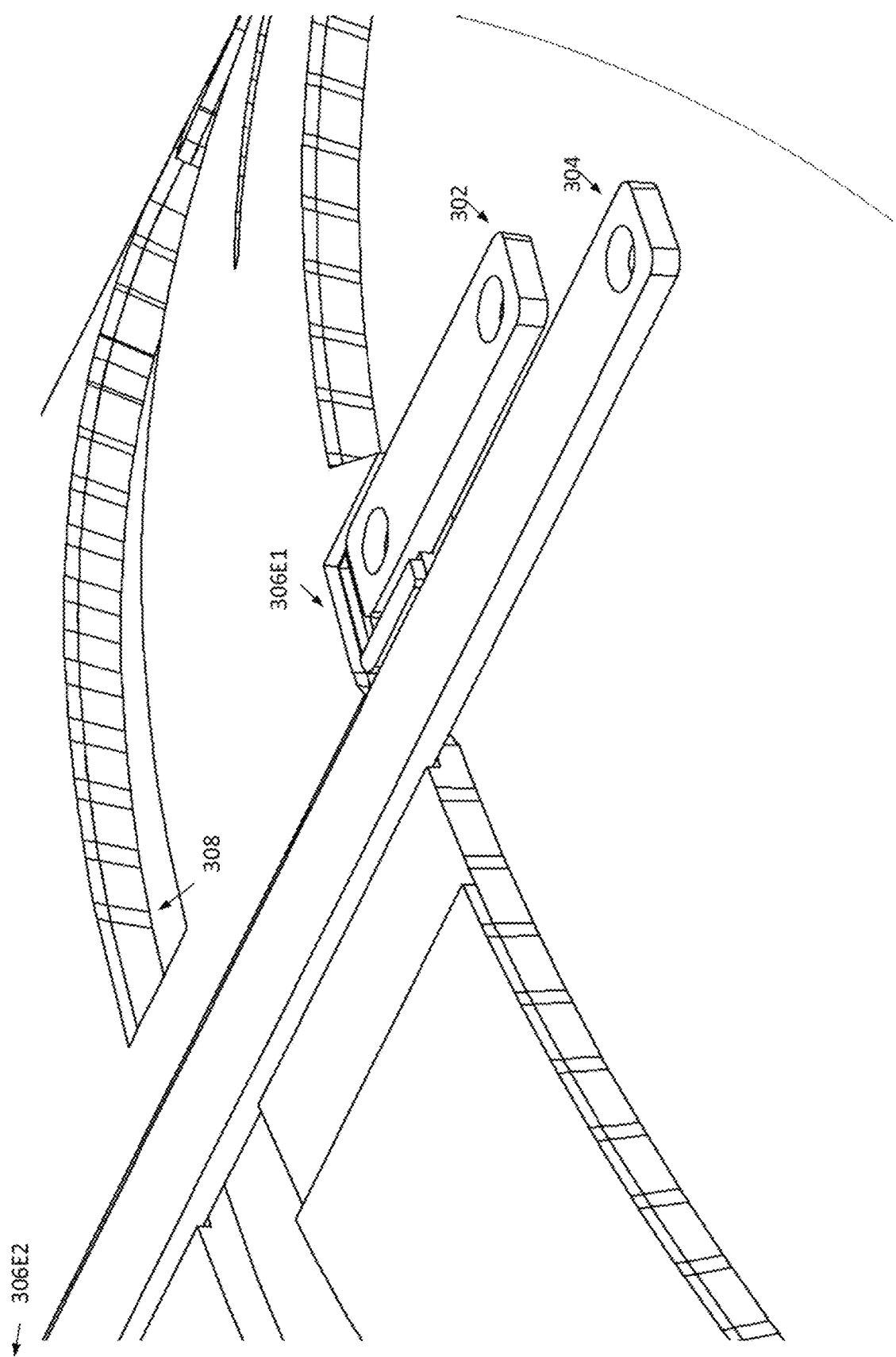

Briefly referring to FIGS. 3A to 3C, a prototype gradient coil assembly 300 is shown. In one illustration from FIG.

3A, earlier examples may place current feeding connectors 302 and 304 on the radial layer 306. While these examples may be expeditiously configured, in other examples, as shown in FIGS. 3B to 3C, a first current feeding connector 302 is embedded in radial layer 306 at a first end 306E1 while a second current feeding connector 304 is embedded in radial layer 306 at a second end 306E2. A gradient coil, for example, an x-axis gradient coil or a y-axis gradient coil may be, placed at region 308 of radial layer 306. Currents may flow into the gradient coil in region 308 through the first current feeding connector 302 and then flow out of the gradient coil through the second current feeding connector 304. Comparing and contrasting FIGS. 3A to 3C reveals the savings in the radial extent as occupied by the current feeding connector.

Returning to FIG. 2A, the bottom panel shows a cross-sectional view to illustrate the embedded placement of the current feeding connectors 202 and 204. Here, the current feeding connectors 202 and 204 have rectangular profiles and are embedded into the radial layer 206 in a manner that neither of the current feeding connectors extend above the outer surface of radial layer 206.

FIG. 2B shows a similar radial layer 216 on an outer surface on a cylindrical structure that houses the windings of coils, as illustrated by the spiral lines. Again, these coil windings form the backbone of a gradient coil assembly from which perturbations to the main magnetic field are generated, as illustrated, for example, in the perspective view of FIG. 3. Here, the cylindrical structure has a first end 216E1 and a second end 216E2. A first current feeding connector 212 is located at the first end 216E1 while a second current feeding connector 204 is located at the second end 216E2. Currents can flow into the windings of coils through one of the current feeding connectors and then flow out of the windings of coils through the other of the current feeding connectors. The bottom panel shows a cross-sectional view to illustrate the embedded placement. A side-by side comparison with FIG. 2A reveals that, the current feeding connectors 212 and 214 have rectangular profiles and may be inlaid on the outer surface of the radial layer 216 by virtue of a reduced height but increased lateral span. More particularly, the cross cuts of FIG. 2B break up large area surfaces to reduce the formation of large loop eddy currents, since these connectors operate in a rapidly changing magnetic field environment by virtue of being inside a gradient coil. Without the cross cuts, these connectors would experience greater eddy current heating. The cross cuts also help constrain the current flow to be in the center of the connector, as designed. The arrangement in FIG. 2B maintains a high cross section area for most of the connector, compared when the connector is narrowed, thus having substantially similar Ohmic heating characteristics to a thicker and narrower connector. More details on the particular design and rationale can be found in a co-pending PCT Patent Application, WO2017077368 A1, which is incorporated by reference in its entirety.

In these illustrations, the gradient coil may be coupled to a gradient amplifier through the current feeding connectors. Indeed, these current feeding connectors are capable of handling currents up to root mean square (RMS) 400 A in continuous mode. The gradient amplifier drives the gradient coil assembly through the current feeding connectors with sufficient currents suitable to generate perturbations to the volume of magnet field that are along and transverse a longitudinal axis of the bore.

Figure 4A:
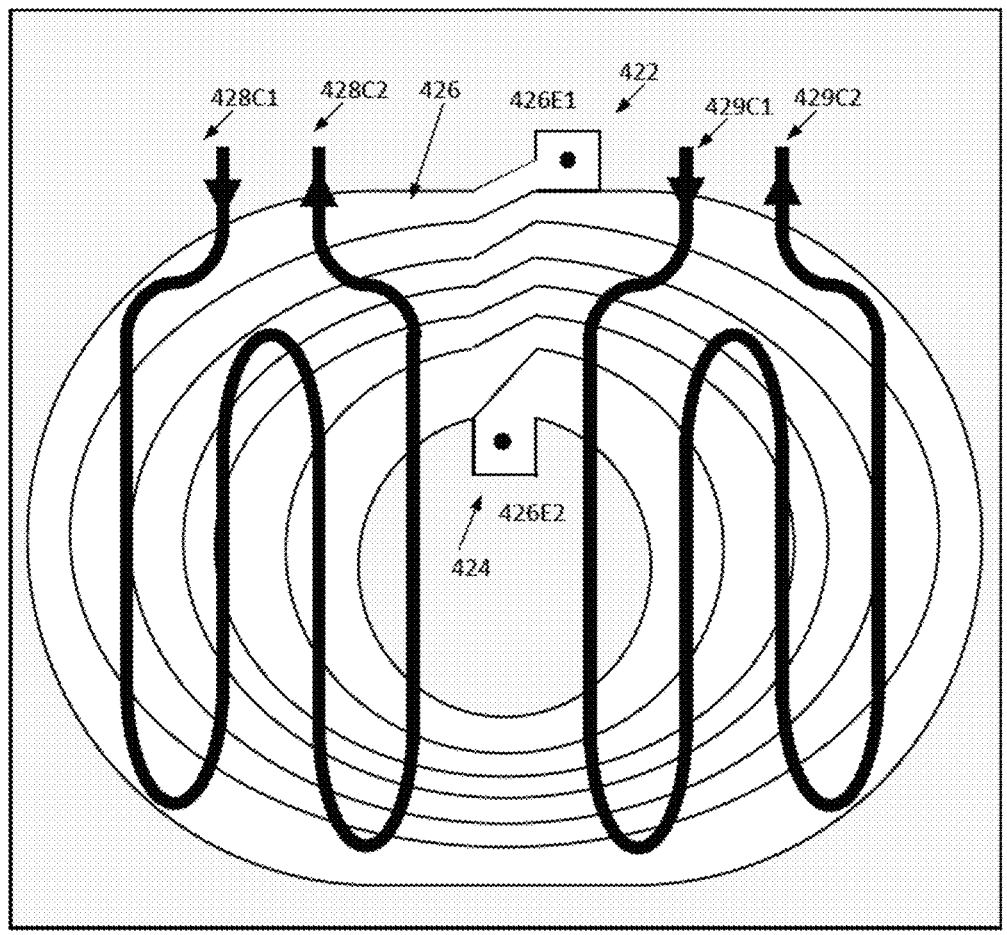
FIGS. 4A to 4C illustrate examples of reducing the spatial extent of cooling structures in a magnetic resonance imaging (MRI) system.
Figure 4A:
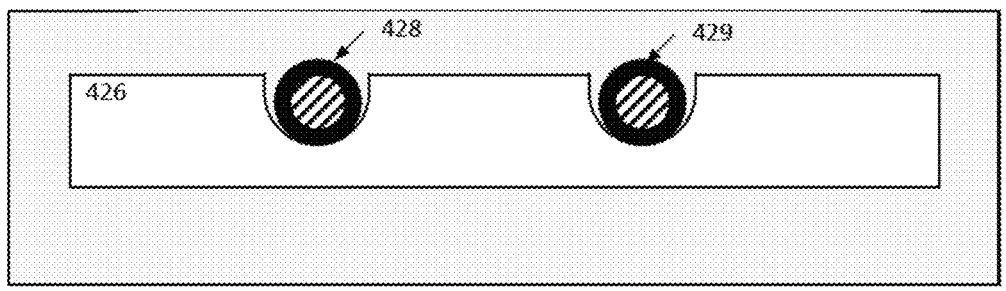
Figure 4B:
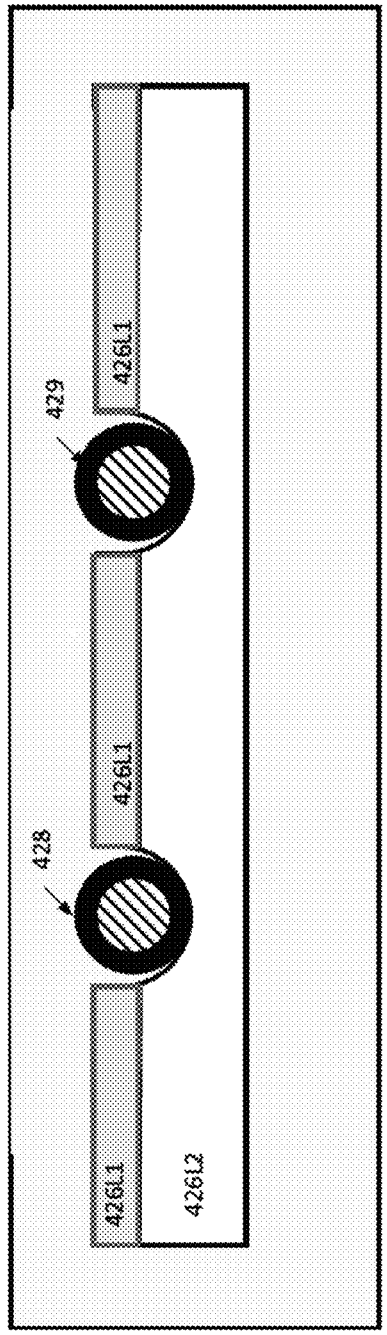
Figure 4C:
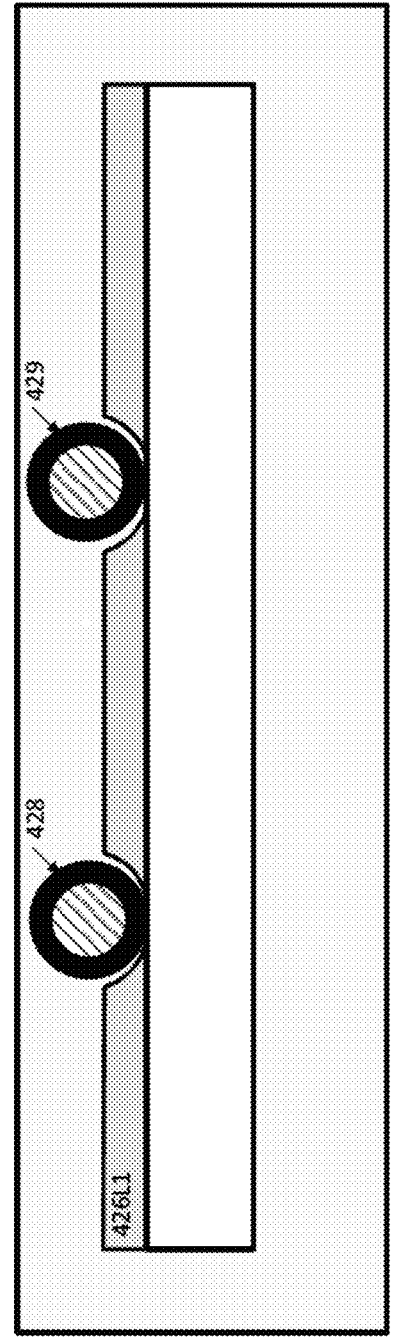

Referring to FIGS. 4A to 4C, an illustration shows another similar radial layer 426 that houses cooling structures such as cooling lines 428 and 429 in the same radial layer as the gradient coil current feeding connectors 422 and 424. The cooling lines 428 and 429 can be arranged in proximity to the heat-generating radial layer 426 housing, for example, a gradient coil assembly. The gradient coil assembly may include current feeding connectors 422 and 424 that are respectively located at first end 426E1 and second end 426E2 with respect to radial layer 426. The proximity in placement allows heat to be extracted from radial layer 426 through conduction and convection. The cooling lines 428 and 429 may be embedded or inlayed in channels cut into radial layer 426. Coolant (e.g., water) may flow into inlet 428C1 and out of outlet 428C2. Likewise, 429C1 is a coolant inlet and 429C2 is a coolant outlet. The coolant may flow from other tubing or manifolds placed inside the gradient coil assembly in radial layer 426 or outside the gradient coil assembly in radial layer 426. While in this illustration the cooling lines (428 and 429) and the gradient coil current feeding connectors (422 and 424) are placed in the same radial layer 426, in some configurations, the cooling lines and the gradient coil current feeding connectors 426 may be placed in different but adjacent radial layers, each of which configured with reduced radial profile to accommodate efficient spatial stacking.

The illustration also shows one tubing represented by two tubing structures representing cooling lines, namely 428 and 429, to provide cooling during operation of the magnetic resonance imaging system. The first loop is from a first end 428C1 to a second end 428C2. The second loop is from a third end 429C1 to a fourth end 429C2. The bottom panel at FIG. 4A shows a cross sectional view of the radial layer 426 in one embodiment where tubing structures (representing cooling lines 428 and 429) have circular profiles and are embedded in radial layer 426. In some cases, the tubing structures 428 and 429 may be made of heat conducting material (with some electrical insulation provided between the cooling tube structures and the radial layer 426). In other cases, the tubing may be made of non-conducting material. In one example, as illustrated by FIG. 4A, channels may be milled partially into the radial layer 426 to inlay these tubes fully or partially within the radial layer 426. In another example, the radial layer 426 may include a layer of electrically insulating material bonded to the conductor (i.e. by epoxy) and channels for the coolant tubing may be milled or formed into this insulating material, or into both the insulating material and partially into the conductor of the electromagnet.

The tubes may also be formed into a non-circular cross section (i.e. by means of a press to make oval shaped cross section, or by extruding the tubing material in a non-circular shape) so as to reduce further the radial extent of the cooling tubes without substantially reducing the coolant flow cross section. The cooling tubes would need to be made of a malleable material that remains in the new cross sectional shape (i.e. copper or some kinds of plastic). The cooling structures may be placed on the inside or outside of the curved face of, for example, radial layer 426 to provide cooling when, for example, the gradient coils are driven with sufficient currents for MRI imaging. Here, inlaying the cooling tubes are inspired by the same motivations as inlaying the electrical connecting pieces because the advantages derived are comparable. Indeed, the inventive concept of embedding current feeding connectors may be extended to spur development of shimming coils as well as cooling structures based on similar motivations and advantages. In the case of shimming coils, the shimming coils do not need to be on the particular radial layer. In fact, the shimming coils can be located on different radial layers.

As used herein, the terms "comprises" and "comprising" are to be construed as being inclusive and open ended, and not exclusive. Specifically, when used in the specification and claims, the terms "comprises" and "comprising" and variations thereof mean the specified features, steps or components are included. These terms are not to be interpreted to exclude the presence of other features, steps or components.

As used herein, the term "exemplary" means "serving as an example, instance, or illustration," and should not be construed as preferred or advantageous over other configurations disclosed herein.

As used herein, the terms "about" and "approximately" are meant to cover variations that may exist in the upper and lower limits of the ranges of values, such as variations in properties, parameters, and dimensions. In one non-limiting example, the terms "about" and "approximately" mean plus or minus 10 percent or less.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A magnetic resonance (MR) imaging system, comprising:
    a housing having a bore shaped and sized to accommodate at least a portion of a subject;
    a main magnet accommodated by the housing and configured to generate a volume of magnet field suitable for forming MR imaging over a region located within the bore and covered by the volume of magnetic field;
    a transmit radio frequency (RF) coil assembly configured to transmit at least one RF pulse into the portion of the subject;
    a receive radio frequency (RF) coil assembly configured to, in response to the at least one RF pulse, receive MR signals emitted from the portion of the subject;
    a gradient coil assembly comprising (i) windings of coils arranged in a radial layer, and (ii) a first set of electrical connectors embedded in the radial layer to reduce a radial extent occupied by the gradient coil assembly, wherein at least one electrical connector from the first set of electrical connectors crosses over portions of the windings of coils in the radial layer, and wherein the first set of electrical connectors are configured to drive the windings of coils with sufficient currents suitable to generate perturbations to the volume of magnet field such that the MR signals encode an MR image over the region and in accordance with the generated perturbations,
        wherein the radial layer comprises a depressed area where the at least one electrical connector from the first set of electrical connectors is inlaid such that the first set of electrical connectors are, at least in part, radially constrained between the radial layer's outer surface and inner surface; and
    a control unit coupled to the transmit RF coil assembly, the receive RF coil assembly, and the gradient coil assembly, the control unit configured to synchronously operate the gradient coil assembly, the transmit RF coil assembly, and the receive RF coil assembly.

2. The MRI system of claim 1, wherein electrical insulation material is disposed between the first set of electrical connectors and underlying portions of the radial layer.

3. The MRI system of claim 1, wherein the gradient coil assembly is configured to generate perturbations to the volume of magnet field along a longitudinal axis of the bore or transverse to the longitudinal axis of the bore.

4. The MRI system of claim 1, further comprising:
    shield gradient coils arranged radially outside the windings of coils of the gradient coil assembly and configured to generate a varying magnetic field that attenuates a different varying magnetic field generated by the gradient coil assembly outside of the bore.

5. The MRI system of claim 1, further comprising:
    shimming coils located on the radial layer or a different radial layer, wherein the shimming coils are configured to improve a homogeneity of the magnetic field within the region for MR imaging, wherein the shimming coils are driven by shimming currents provided through a second set of electrical connectors located on the radial layer or a different radial layer, wherein the second set of electrical connectors are different from the first set of electrical connectors.

6. The MRI system of claim 1, further comprising:
    cooling structures inlaid in the radial layer and configured to provide cooling when the windings of coils of the gradient coil assembly are driven with sufficient currents suitable to generate perturbations to the volume of magnet field.

7. The MRI system of claim 1, wherein the gradient coil assembly is coupled to a gradient amplifier through the first set of electrical connectors.

8. The MRI system of claim 7, wherein the first set of electrical connectors are configured to receive currents up to root mean square (rms) 400 A continuous.

9. The MRI system of claim 7, wherein the gradient amplifier drives the gradient coil assembly through the first set of electrical connectors with sufficient currents suitable to generate perturbations to the volume of magnet field that are along and transverse a longitudinal axis of the bore.

10. The MRI system of claim 1, wherein the control unit is further configured to reconstruct a magnetic resonance (MR) image based on the MR signals.

11. The MRI system of claim 1, further comprising:
    a display on which the MR image is presented.

12. A method for manufacturing an MRI system, the method comprising:
    configuring a housing that includes a bore shaped and sized to accommodate at least a portion of a subject;
    arranging a main magnet to be accommodated by the housing and configuring the main magnet to generate a volume of magnet field suitable for forming MR imaging over a region located within the bore and covered by the volume of magnetic field;
    configuring a transmit radio frequency (RF) coil assembly capable of transmitting at least one RF pulse into the portion of the subject;
    configuring a receive radio frequency (RF) coil assembly capable of, in response to the at least one RF pulse, receiving MR signals emitted from the portion of the subject;
    configuring a gradient coil assembly by:
        arranging windings of coils arranged in a radial layer, and
        embedding a first set of electrical connectors in the radial layer to reduce a radial extent occupied by the gradient coil assembly, wherein at least one electrical connector from the first set of electrical connections crosses over portions of the windings of coils in the radial layer, and configuring the first set of electrical connectors to drive the windings of coils with sufficient currents suitable to generate perturbations to the volume of magnet field such that the MR signals encode an MR image over the region and in accordance with the generated perturbations, and wherein embedding the first set of electrical connectors comprises inlaying the first set of electrical connectors in a depressed area on the radial layer such that the first set of electrical connectors are, at least in part, radially constrained between the radial layer's outer surface and inner surface; and configuring a control unit to be coupled to the transmit RF coil assembly, the receive RF coil assembly, and the gradient coil assembly such that the control unit is capable of synchronously operating the gradient coil assembly, the transmit RF coil assembly, and the receive RF coil assembly.

13. The method of claim 12, wherein embedding the first set of electrical connectors in a depressed area comprises soldering the first set of electrical connectors to provide an electrical connection to the windings of coils, and wherein the electrical connection is formed in the depressed area such that the first set of electrical connectors do not extend above the outer surface of the radial layer.

14. The method of claim 12, further comprising:

arranging shield gradient coils radially outside the windings of coils of the gradient coil assembly; and configuring the shield gradient coil to be capable of generating a varying magnetic field that attenuates a different varying magnetic field generated by the gradient coil assembly outside of the bore.

15. The method of claim 12, further comprising:

arranging shimming coils to be positioned on the inside or the outside of the radial layer; and configuring the shimming coils to improve a homogeneity of the magnetic field within the region for MR imaging when the shimming coils are driven by shimming currents provided through a second set of electrical connectors different from the first set of electrical connectors.

16. The method of claim 12, further comprising:

arranging cooling structures to be positioned on the radial layer or on a different radial layer underneath the radial layer; and configuring the cooling structures such that cooling is effectuated when the windings of coils of the gradient coil assembly are driven with sufficient currents suitable to generate perturbations to the volume of magnet field.

17. The method of claim 12, further comprising:

coupling the gradient coil assembly to a gradient amplifier through the first set of electrical connectors capable of receiving currents up to root mean square (rms) 400 A continuous.

18. The method of claim 12, further comprising:

coupling the control unit to a display such that when the control unit has reconstructed an magnetic resonance (MR) image based on the MR signals, the display is configured to present the reconstructed MR image.

* * * * *